US012672404B2

(12) United States Patent
Fujihara et al.

(10) Patent No.: US 12,672,404 B2
(45) Date of Patent: Jun. 30, 2026

(54) SEMICONDUCTOR DEVICE

(71) Applicants:Kabushiki Kaisha Toshiba, Tokyo
(JP); **Toshiba Electronic Devices &
Storage Corporation**, Tokyo (JP)

(72) Inventors: Mami Fujihara, Nakatsu Oita (JP);
Toshihide Osanai, Buzen Fukuoka (JP);
Naoya Takai, Yukuhashi Fukuoka (JP)

(73) Assignees: Kabushiki Kaisha Toshiba, Kawasaki
(JP); **Toshiba Electronic Devices &
Storage Corporation**, Kawasaki (JP)

( * ) Notice: Subject to any disclaimer, the term of this
patent is extended or adjusted under 35
U.S.C. 154(b) by 503 days.

(21) Appl. No.: 18/181,072

(22) Filed: Mar. 9, 2023

(65) Prior Publication Data

US 2024/0105889 A1 Mar. 28, 2024

(30) Foreign Application Priority Data

Sep. 22, 2022 (JP) ................................. 2022-151767

(51) Int. Cl.
*H10H 20/854* (2025.01)
*H10H 20/831* (2025.01)
*H10H 20/857* (2025.01)

(52) U.S. Cl.
CPC ...... *H10H 20/854* (2025.01); *H10H 20/8312*
(2025.01); *H10H 20/857* (2025.01)

(58) Field of Classification Search
CPC ............. H10H 20/854; H10H 20/8312; H10H
20/857; H04B 10/802; H01L 25/167
See application file for complete search history.

(56) References Cited

U.S. PATENT DOCUMENTS 9,099,602 B2 8/2015 Noguchi et al.
11,094,681 B2 8/2021 Saito et al.
(Continued)

FOREIGN PATENT DOCUMENTS

JP 2011-217427 A 10/2011
JP 2015-050281 A 3/2015
(Continued)

OTHER PUBLICATIONS

Notice of Reasons for Refusal mailed Jun. 12, 2025 in correspond-
ing Japanese Patent Application No. 2022-151767, 10 pages (with
Translation).

*Primary Examiner* — Su C Kim
(74) *Attorney, Agent, or Firm* — Kim & Stewart LLP

(57) ABSTRACT

A semiconductor device includes an input-side lead, a light-
emitting element on the input-side lead, an output-side lead,
a switching element on the output-side lead, and a light-
receiving element on the switching element. The switching
element is provided between the light-emitting element and
the output-side lead. The switching element includes a
front-side electrode and a control pad arranged along a front
surface side thereof. The light-receiving element is provided
on the front-side electrode of the switching element via an
insulative connection member. The light-receiving element
is positioned between the first switching element and the
light-emitting element. The light-receiving element includes
first and second bonding pads; the first bonding pad is
electrically connected to the control pad of the switching
element via a first conductive member; and the second
bonding pad is electrically connected to the front-side elec-
trode of the switching element via a second conductive
member.

16 Claims, 8 Drawing Sheets

(56)          References Cited

U.S. PATENT DOCUMENTS

| | | | |
|---|---|---|---|
| 2007/0187629 A1* | 8/2007 | Matsuyama | ............ H10F 55/10 |
| | | | 257/E31.097 |
| 2011/0242861 A1 | 10/2011 | Ayukawa | |
| 2014/0374776 A1* | 12/2014 | Nakasuji | .............. H01L 25/167 |
| | | | 257/82 |
| 2020/0091367 A1 | 3/2020 | Nakashima et al. | |

FOREIGN PATENT DOCUMENTS

| | | | |
|---|---|---|---|
| JP | 6216418 | B2 | 10/2017 |
| JP | 2018-195838 | A | 12/2018 |
| JP | 2020-047778 | A | 3/2020 |
| JP | 2020-096105 | A | 6/2020 |
| JP | 2023-078547 | A | 6/2023 |

* cited by examiner

SEMICONDUCTOR DEVICE

CROSS-REFERENCE TO RELATED APPLICATIONS

This application is based upon and claims the benefit of priority from Japanese Patent Application No. 2022-151767, filed on Sep. 22, 2022; the entire contents of which are incorporated herein by reference.

FIELD

Embodiments relate to a semiconductor device.

BACKGROUND

Semiconductor devices are required to be downsized. A semiconductor device is provided with, for example, a resin package in which a photocoupler and a switching element are sealed. In such a device, the switching element has a chip size enlarged as increasing the current capacity thereof. Thus, the resin package size is also enlarged as increasing the current capacity.

DETAILED DESCRIPTION

Figure 1A:
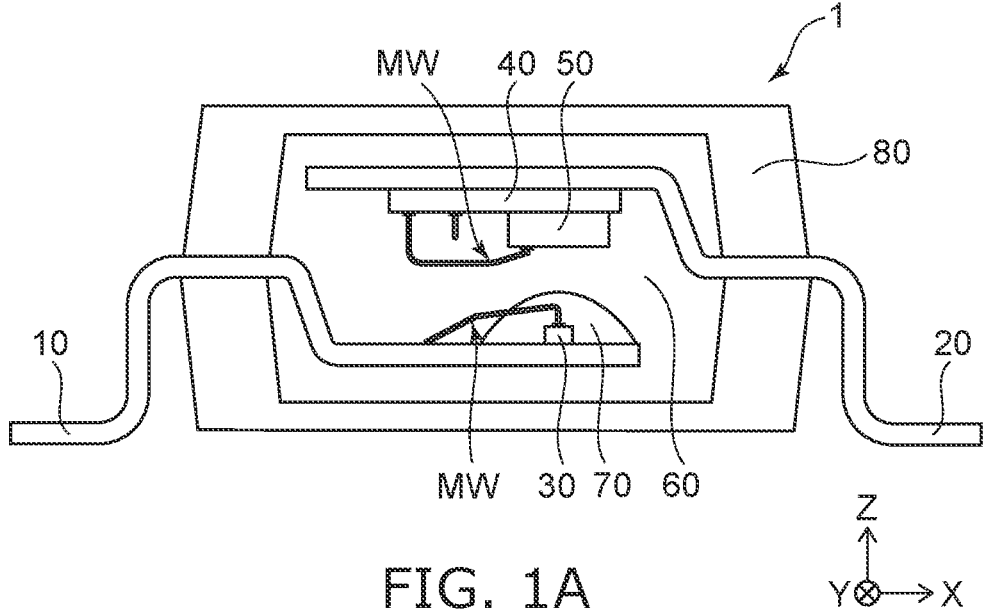
FIGS. 1A and 1B are schematic views showing a semiconductor device according to an embodiment.

According to one embodiment, a semiconductor device includes an input-side lead, a light-emitting element provided on the input-side lead, a first output-side lead facing the input-side lead via the light-emitting element, a first switching element provided on the first output-side lead, a light-receiving element provided on the first switching element, and a first resin member sealing the light-emitting element on the input-side lead and sealing the first switching element and the light-receiving element on the first output-side lead. The first switching element is positioned between the light-emitting element and the first output-side lead. The first switching element includes a backside electrode, a front-side electrode and a control pad. The backside electrode is connected to the first output-side lead; the front-side electrode is positioned at a side opposite to the backside electrode; and the front-side electrode and the control pad are arranged along a front surface side of the first switching element. The light-receiving element is connected to the front-side electrode of the first switching element via an insulative connection member. The light-receiving element is positioned between the first switching element and the light-emitting element. The light-receiving element includes a first bonding pad and a second bonding pad; the first bonding pad is electrically connected to the control pad of the first switching element via a first conductive member; and the second bonding pad is electrically connected to the front-side electrode of the first switching element via a second conductive member. The first resin member includes a portion interposed between the light-emitting element and the light-receiving element; and the first resin member transmits light radiated from the light-emitting element toward the light-receiving element.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
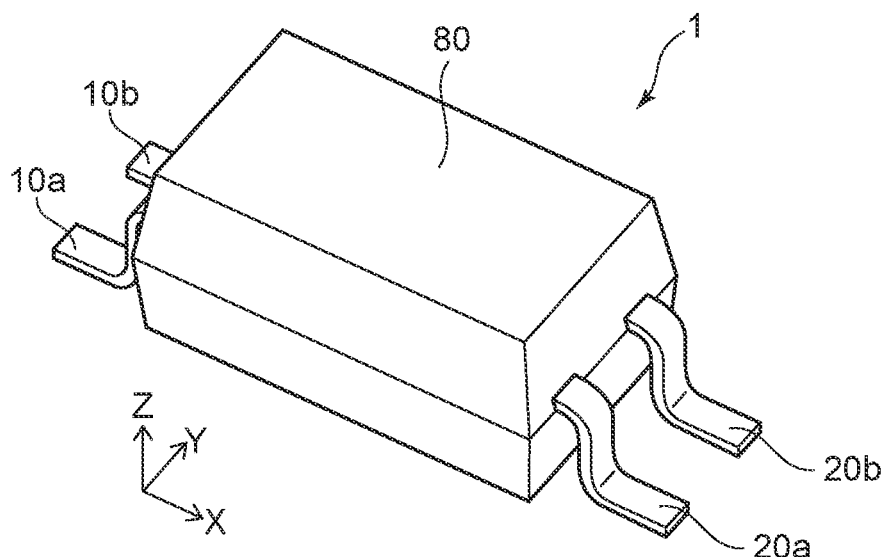

FIGS. 1A and 1B are schematic views showing a semiconductor device 1 according to an embodiment. FIG. 1A is a cross-sectional view showing the semiconductor device 1. FIG. 1B is a perspective view showing the appearance of the semiconductor device 1. The semiconductor device 1 is, for example, a photo-relay.

As shown in FIG. 1A, the semiconductor device 1 includes an input-side lead 10, an output-side lead 20, a light-emitting element 30, a switching element 40, and a light-receiving element 50. The input-side lead 10 and the output-side lead 20 are, for example, gold-plated copper plates.

The light-emitting element 30 is provided on the input-side lead 10. The light-emitting element 30 is, for example, a light-emitting diode. The light-emitting element 30 is electrically connected to the input-side lead 10 via a conductive member MW, e.g., a metal wire.

The output-side lead 20 faces the input-side lead 10 via the light-emitting element 30. The switching element 40 is provided on the output-side lead 20. The switching element 40 is positioned between the light-emitting element 30 and the output-side lead 20. The switching element 40 is, for example, a MOS transistor.

The light-receiving element 50 is provided on the switching element 40. The light-receiving element 50 is positioned between the light-emitting element 30 and the switching element 40. The light-receiving element 50 is electrically connected to the switching element 40 via another conductive member MW. The light-receiving element 50 is, for example, a photodiode.

The semiconductor device 1 further includes a first resin member 60, a second resin member 70, and a third resin member 80.

The first resin member 60 includes a portion interposed between the light-emitting element 30 and the light-receiving element 50; and the first resin member 60 seals the light-emitting element 30 on the input-side lead 10 and seals the switching element 40 and the light-receiving element 50 on the output-side lead. The first resin member 60 is, for example, an epoxy resin.

The second resin member 70 covers the light-emitting element 30 on the input-side lead 10. The first resin member 60 covers the light-emitting element 30 with the second resin member 70 interposed. The second resin member 70 is, for example, silicone.

The first resin member 60 and the second resin member 70 transmit light radiated from the light-emitting element 30 toward the light-receiving element 50. The second resin member 70 relaxes the stress of the first resin member 60.

The third resin member 80 covers the first resin member 60. The third resin member 80 shields external light and the light radiated by the light-emitting element 30. The third resin member 80 is, for example, an epoxy resin in which a shielding material such as carbon, silica, or the like is dispersed. The input-side lead 10 and the output-side lead 20 include portions extending outward from the third resin member 80.

As shown in FIG. 1B, for example, the third resin member 80 is shaped to have a decahedral exterior shape. The input-side leads 10 extend from one side of the third resin member 80, and the output-side leads 20 extend from other side surface of the third resin member 80 opposite to the one side surface. The input-side leads 10 include a first input-side lead 10a and a second input-side lead 10b. The output-side leads 20 include a first output-side lead 20a and a second output-side lead 20b.

In the following description, there may be a case in which the first input-side lead 10a and the second input-side lead 10b are referred to as the input-side lead 10 without differentiating. Other components also are similarly described.

In the semiconductor device 1, the third resin member 80 has the sizes in X-direction and Y-direction, i.e., the resin package size, that can be reduced by overlaying the switching element 40 and the light-receiving element 50 in a Z-direction.

Figure 2:
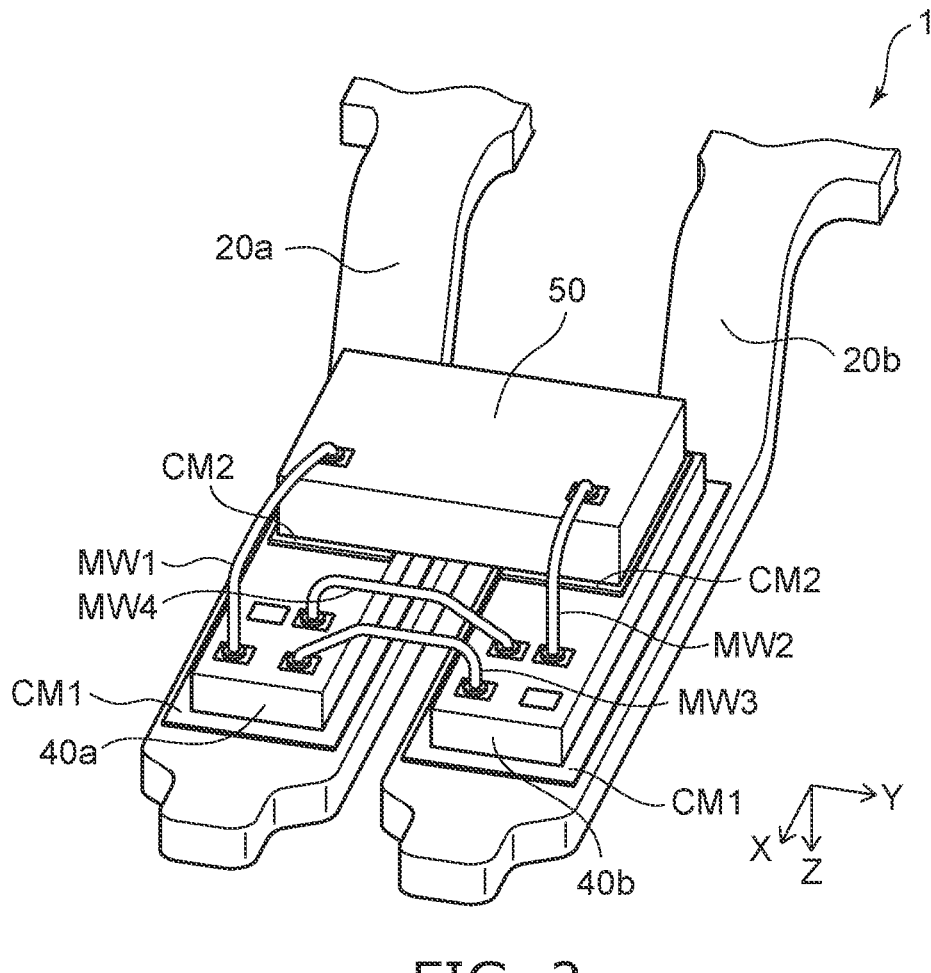
FIG. 2 is a perspective view schematically showing a part of the semiconductor device according to the embodiment.

FIG. 2 is a perspective view schematically showing a part of the semiconductor device 1 according to the embodiment. The semiconductor device 1 includes a first switching element 40a and a second switching element 40b. The first switching element 40a is provided on the first output-side lead 20a with a first connection member CM1 interposed. The second switching element 40b is provided on the second output-side lead 20b with another first connection member CM1 interposed. The first output-side lead 20a and the second output-side lead 20b are arranged, for example, in the Y-direction. Accordingly, the first switching element 40a and the second switching element 40b also are arranged in the Y-direction. The first connection member CM1 is conductive. Thus, the first switching element 40a is electrically connected to the first output-side lead 20a via the first connection member CM1. The second switching element 40b is electrically connected to the second output-side lead 20b via said another first connection member CM1.

The light-receiving element 50 is provided over the first switching element 40a and the second switching element 40b. The light-receiving element 50 is connected to the first and second switching elements 40a and 40b via a second connection member CM2. The second connection member CM2 is, for example, an insulative adhesive (see FIG. 3). The light-receiving element 50 is electrically connected to the first switching element 40a via a first conductive member MW1. The light-receiving element 50 is electrically connected to the second switching element 40b via a second conductive member MW2.

The first switching element 40a is electrically connected to the second switching element 40b via a third conductive member MW3 and a fourth conductive member MW4. The first to fourth conductive members MW1 to MW4 are, for example, metal wires. The first to fourth conductive members MW1 to MW4 are connected to the first switching element 40a and the second switching element 40b at the front surface side connected to the light-receiving element 50.

The third conductive member MW3 and the fourth conductive member MW4 are positioned not to cross the first and second conductive members MW1 and MW2 in a direction, e.g., the Z-direction, perpendicular to the front surface of the switching element 40. The first and second conductive members MW1 and MW2 are provided with a looping height in the direction perpendicular to the front surface of the switching element 40. The looping height of the first and second conductive members MW1 and MW2 can be reduced by not crossing third conductive member MW3 and the fourth conductive member MW4.

As shown in FIG. 1A, when the input-side lead 10 and the output-side lead 20 are arranged such that the light-emitting element 30 and the light-receiving element 50 face each other, it is possible to arrange the light-emitting element 30 and the light-receiving element 50 more proximately by reducing the looping heights of the first and second conductive members MW1 and MW2. In other words, the spacing between the input-side lead 10 and the output-side lead 20 can be reduced. Thus, the height in the Z-direction of the third resin member 80, i.e., the resin package height, can be reduced thereby.

Figure 3:
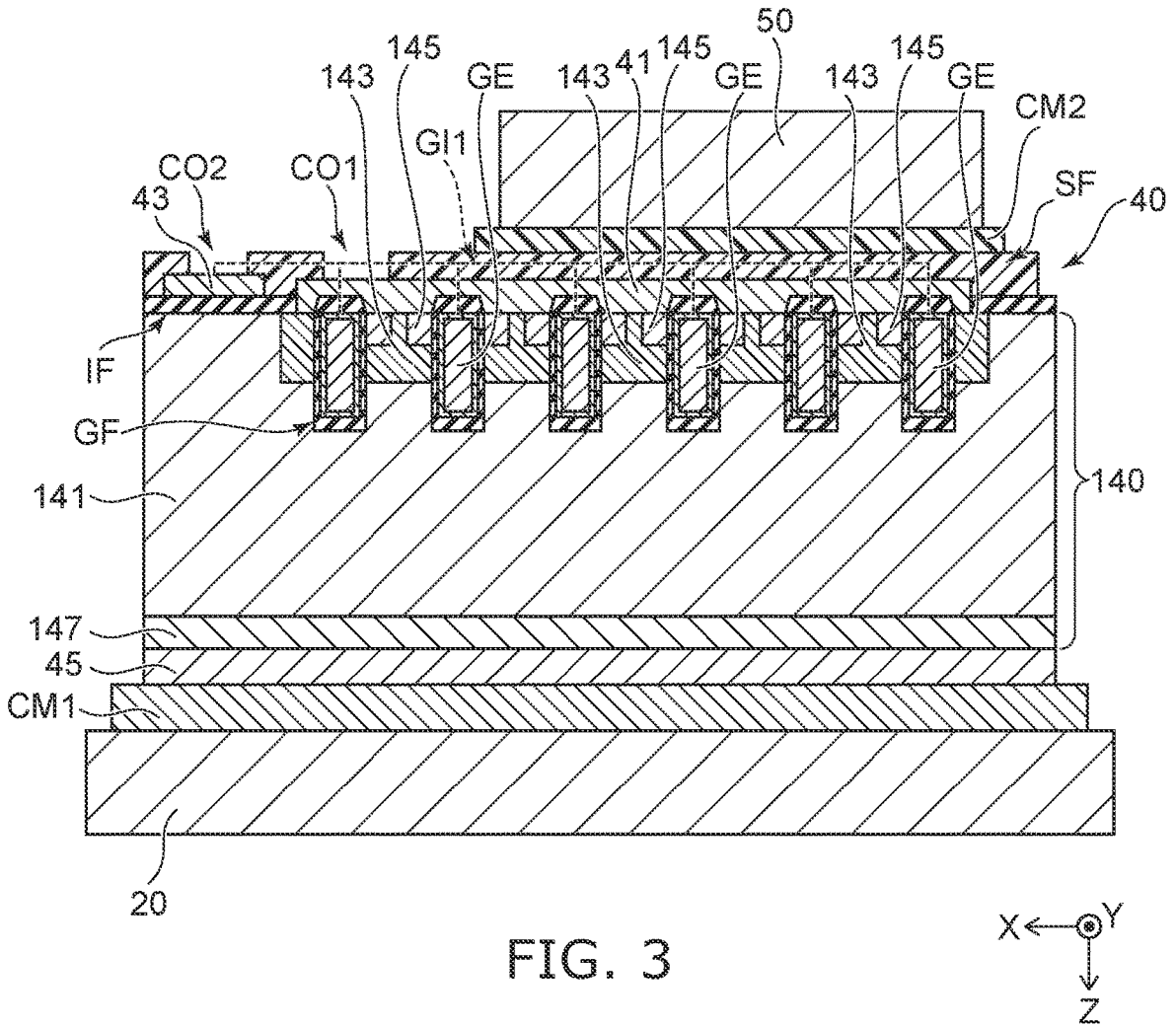
FIG. 3 is a schematic cross-sectional view showing the switching element of the semiconductor device according to the embodiment.

FIG. 3 is a schematic cross-sectional view showing the switching element 40 of the semiconductor device 1 according to the embodiment. The switching element 40 includes a front-side electrode 41, a control pad 43, a backside electrode 45, a semiconductor part 140, and a control electrode GE.

The front-side electrode 41 is provided at the front side of the semiconductor part 140 facing the light-emitting element 30 (see FIG. 1A). The front-side electrode 41 and the control pad 43 are arranged at the front side of the semiconductor part 140. The control pad 43 is apart from the front-side electrode 41.

The light-receiving element 50 is connected on the front-side electrode 41 via an insulating member SF and the insulative second connection member CM2. The insulating member SF is, for example, a polyimide film. The insulating member SF covers the front-side electrode 41. The insulating member SF has an opening CO1 at a position on which the light-receiving element 50 is not connected. The front-side electrode 41 is exposed in the opening CO1.

The backside electrode 45 is provided on the back surface of the semiconductor part 140. The backside electrode 45 is connected to the output-side lead 20, for example, via the first connection member CM1. The first connection member CM1 is, for example, silver paste and is conductive. The backside electrode 45 is electrically connected to the output-side lead 20 via the first connection member CM1.

The control electrode GE is, for example, a gate electrode. The control electrode GE has a trench gate structure and is provided, for example, between the front-side electrode 41 and the backside electrode 45. The control electrode GE is electrically insulated from the semiconductor part 140 by a gate insulating film GF. Also, the control electrode GE is electrically insulated from the front-side electrode 41 by an inter-layer insulating film IF.

The control pad 43 is electrically connected to the control electrode GE by, for example, control wiring GI1 shown by a broken line in FIG. 3. The control pad 43 is provided at the front side of the semiconductor part 140 with the inter-layer insulating film IF interposed. The insulating member SF partially covers the control pad 43 and has an opening CO2 in which the control pad 43 is exposed.

The semiconductor part 140 includes, for example, an n-type drift layer 141, a p-type base layer 143, an n-type source layer 145, and an n-type drain layer 147. The p-type base layer 143 is provided between the n-type drift layer 141 and the front-side electrode 41. The n-type source layer 145 is partially provided on the p-type base layer 143 between the p-type base layer 143 and the front-side electrode 41. The n-type drain layer 147 is provided between the n-type drift layer 141 and the backside electrode 45.

The front-side electrode 41 is electrically connected to the p-type base layer 143 and the n-type source layer 145. The p-type base layer 143 faces the control electrode GE via the gate insulating film GF between the n-type drift layer 141 and the n-type source layer 145. The backside electrode 45 is electrically connected to the n-type drain layer 147.

Figure 4:
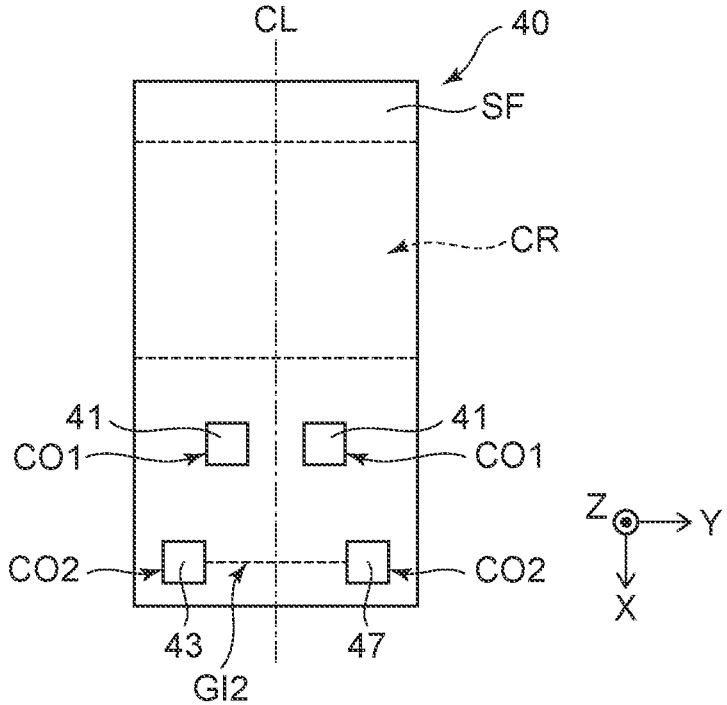
FIG. 4 is a schematic plan view showing the switching element of the semiconductor device according to the embodiment.

FIG. 4 is a schematic plan view showing the switching element 40 of the semiconductor device 1 according to the embodiment. FIG. 4 illustrates the front side of the switching element 40 connected to the light-receiving element 50.

As shown in FIG. 4, the insulating member SF covers the front surface of the switching element 40 facing the light-emitting element 30. The insulating member SF has, for example, two openings CO1 and two openings CO2. The openings CO1 and CO2 are provided at, for example, positions that are line-symmetric with respect to a center line CL extending in the X-direction.

The front-side electrode 41 is exposed in the opening CO1. In the example, the two openings CO1 are apart from each other. Alternatively, the two openings CO1 may be linked to each other.

The control pad 43 and a control pad 47 are respectively exposed in the two openings CO2. Similarly to the control pad 43 (see FIG. 3), the control pad 47 is provided at the front side of the semiconductor part 140 with the inter-layer insulating film IF interposed. The control pad 43 and the control pad 47 are electrically connected by, for example, control wiring GI2 shown by a broken line in FIG. 4. In other words, the control pad 47 is electrically connected to the control electrode GE, for example, via the control pad 43.

The switching element 40 includes a connection region CR at which the light-receiving element 50 is connected. The openings CO1 are provided between the openings CO2 and the connection region CR. The two openings CO2 have a wider spacing than a spacing between the two openings CO1.

As describe above, the switching element 40 includes the two opening CO1 exposing the front-side electrode 41 and the two opening CO2 exposing respectively the control pads 43 and 47. Therefore, the same chip can be used for the first and second switching elements 40*a* and 40*b* without changing the wire connection manner (see FIG. 2). That is, it is possible to reduce the cost for preparing the first and second switching elements 40*a* and 40*b* each having a suitable arrangement of the openings CO1 and CO2.

Figure 5A:
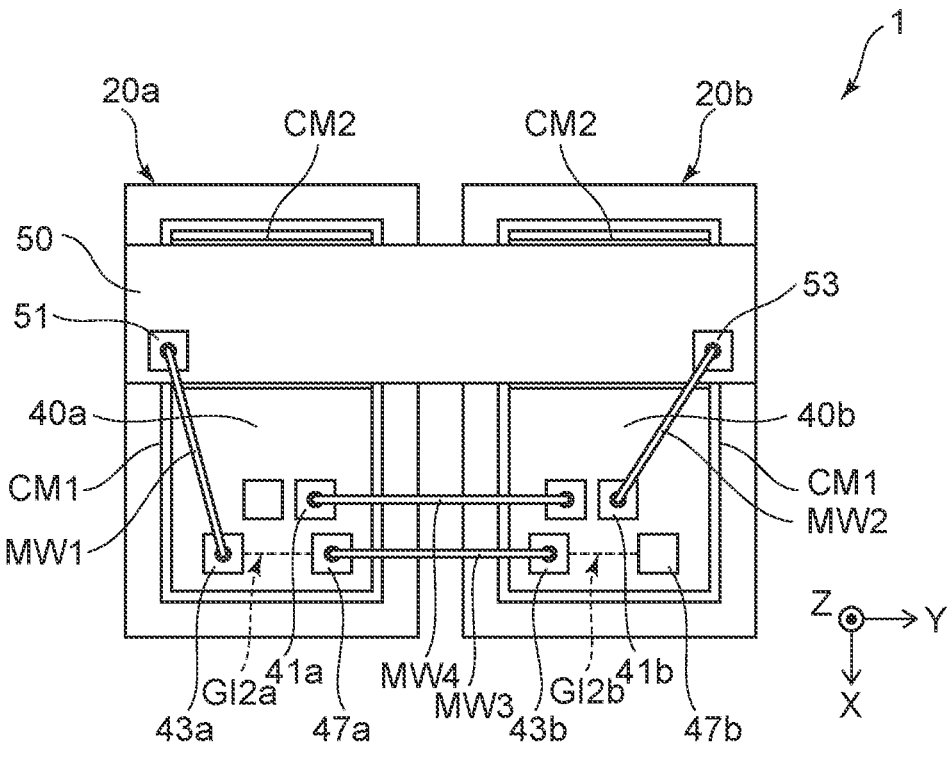
FIGS. 5A and 5B are schematic views showing a portion of the semiconductor device according to the embodiment.
Figure 5B:
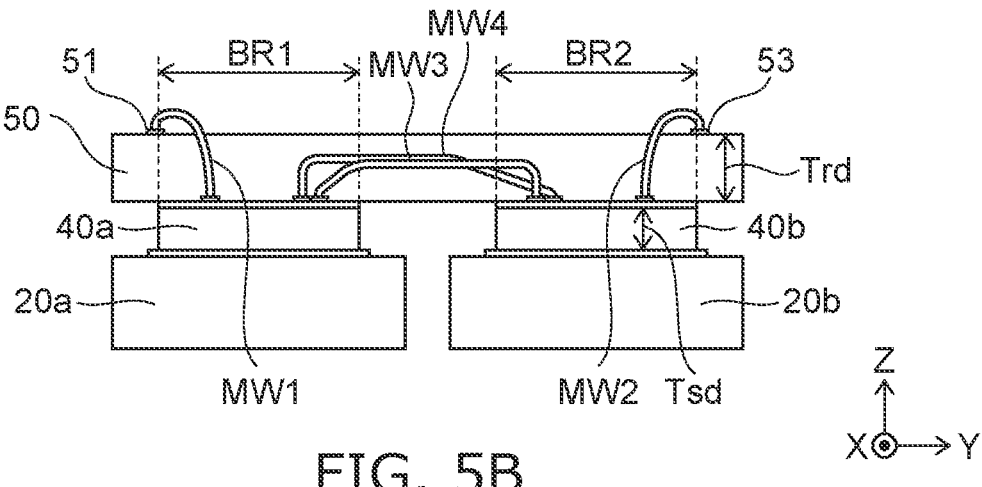

FIGS. 5A and 5B are schematic views showing a portion of the semiconductor device 1 according to the embodiment. FIG. 5A is a plan view showing the switching element 40 and the light-receiving element 50 stacked on the output-side lead 20; and FIG. 5B is a side view thereof.

As shown in FIG. 5A, the light-receiving element 50 includes a first bonding pad 51 and a second bonding pad 53. The first bonding pad 51 is electrically connected to a control pad 43*a* of the first switching element 40*a* via the first conductive member MW1. The second bonding pad 53 is electrically connected to a front-side electrode 41*b* of the second switching element 40*b* via the second conductive member MW2.

A control pad 47*a* of the first switching element 40*a* is electrically connected to a control pad 43*b* of the second switching element 40*b* via the third conductive member MW3. The control pad 47*a* of the first switching element 40*a* is electrically connected to the control pad 43*a* via control wiring GI2*a*. Accordingly, the first bonding pad 51 of the light-receiving element 50 also is electrically connected to the control pad 43*b* of the second switching element 40*b* via the first and third conductive members MW1 and MW3.

A front-side electrode 41*a* of the first switching element 40*a* is electrically connected to the front-side electrode 41*b* of the second switching element 40*b* via the fourth conductive member MW4. Accordingly, the second bonding pad 53 of the light-receiving element 50 also is electrically connected to the front-side electrode 41*a* of the first switching element 40*a* via the second and fourth conductive members MW2 and MW4.

By providing the openings CO1 and CO2 shown in FIG. 4, the first conductive member MW1 and the second conductive member MW2 can be provided without crossing the third and fourth conductive members MW3 and MW4 in the Z-direction.

As shown in FIG. 5B, the light-receiving element 50 includes a first bonding region BR1 and a second bonding region BR2. The bonding region BR1 overlaps the first switching element 40*a* in the Z-direction. The bonding region BR2 overlaps the second switching element 40*b* in the Z-direction.

The first bonding pad 51 of the light-receiving element 50 is preferably provided in the first bonding region BR1. The second bonding pad 53 of the light-receiving element 50 is preferably provided in the second bonding region BR2. The first conductive member MW1 includes, for example, a bonding ball connected to the first bonding pad 51, and at least the center of the bonding ball is desired to be positioned in the first bonding region BR1. Also, the second conductive member MW2 includes another bonding ball connected to the second bonding pad 53, and at least the center of said another bonding ball is desired to be positioned in the second bonding region BR2. Damage of the light-receiving element 50 due to the load when bonding the first and second conductive members MW1 and MW2 to the first and second bonding pads 51 and 53 can be reduced thereby.

The switching element 40 has a thickness Tsd in the Z-direction, and the light-receiving element 50 has a thickness Trd in the Z-direction. The thickness Tsd of the switching element and the thickness Trd of the light-receiving element 50 are preferably thin to downsize the semiconductor device 1. Thereby, the spacing between the output-side lead 20 and the input-side lead 10 can be reduced when the light-receiving element 50 and the light-emitting element 30 are arranged to face each other; and the height in the Z-direction of the third resin member 80 (i.e., the resin package height) can be reduced.

Moreover, the thickness Tsd of the switching element 40 is preferably the same as the thickness Trd of the light-receiving element 50. When the first output-side lead 20a and the second output-side lead 20b are arranged such that the bonding surfaces thereof on which the first and second switching elements 40 are provided are positioned at the same levels in the Z-direction, the front surfaces of the first and second switching elements 40 also are positioned at the same levels in the Z-direction. Thereby, it is possible to prevent the front-side electrodes 41 and the control pads 43, 47 from inaccuracy in pattern recognition during an automatic bonding process.

However, it is desirable for the light-receiving element 50 to be strong enough to withstand the stress applied in the manufacturing processes performed before sealing with the first resin member 60 because the light-receiving element 50 provided over the output-side leads 20a and 20b that are apart from each other. In other words, the light-receiving element 50 preferably has a high shear strength. Accordingly, the thickness Trd of the light-receiving element 50 is desirable to be thick enough to maintain the strength. The light-receiving element 50 preferably has the thickness Trd that is at least greater than the thickness Tsd of the switching element 40.

Figure 6:
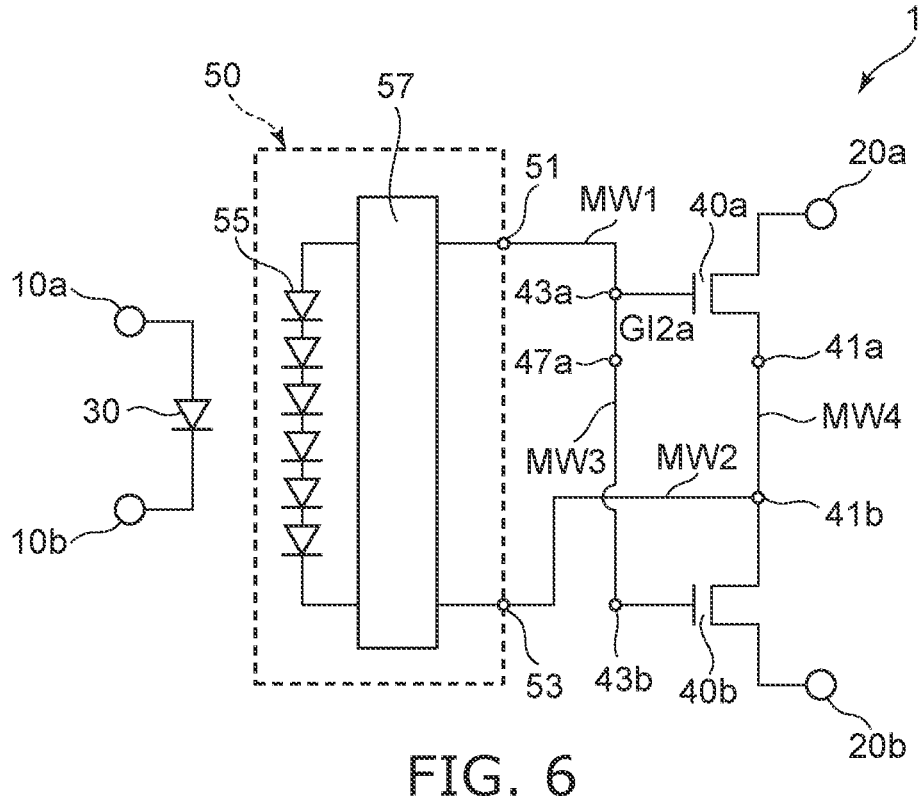
FIG. 6 is a circuit diagram showing the semiconductor device according to the embodiment.

FIG. 6 is a circuit diagram showing the semiconductor device 1 according to the embodiment. The first input-side lead 10a is connected to the anode of the light-emitting element 30. The second input-side lead 10b is connected to the cathode of the light-emitting element 30.

The light-receiving element 50 includes a control circuit 57 and multiple photodiodes 55. The multiple photodiodes 55 are connected in series and face the light-emitting element 30. The photodiodes 55 detect the light radiated by the light-emitting element 30. The control circuit 57 is, for example, a waveform shaping circuit. The control circuit 57 may be a discharging circuit, a protection circuit, etc.

The output of the photodiodes 55 is output to the first and second bonding pads 51 and 53 via the control circuit 57. The first bonding pad 51 is electrically connected to, for example, the anode side of the photodiodes 55. The second bonding pad 53 is electrically connected to, for example, the cathode side of the photodiodes 55.

The first bonding pad 51 of the light-receiving element 50 is electrically connected to the control pad 43a of the first switching element 40a via the first conductive member MW1. The control pad 43a of the first switching element 40a is electrically connected to the control pad 47a of the first switching element 40a via the control wiring GI2a. The control pad 47a is electrically connected to the control pad 43b of the second switching element 40b via the third conductive member MW3.

The second bonding pad 53 of the light-receiving element 50 is electrically connected to the front-side electrode 41b of the second switching element 40b via the second conductive member MW2. The front-side electrode 41b of the second switching element 40b is electrically connected to the front-side electrode 41a of the first switching element 40a via the fourth conductive member MW4.

The first output-side lead 20a is electrically connected to the backside electrode 45 of the first switching element 40a via the first connection member CM1 (see FIG. 3). The second output-side lead 20b is electrically connected to the backside electrode 45 of the second switching element 40b via the other first connection member CM1 (see FIG. 3).

In the semiconductor device 1, for example, the electrical conduction between the first output-side lead 20a and the second output-side lead 20b is on-off controlled by a signal input to the first and second input-side leads 10a and 10b. The light-emitting element 30 radiates an optical signal corresponding to the signal input to the first and second input-side leads 10a and 10b; and the light-receiving element 50 detects the optical signal radiated from the light-emitting element 30. The light-receiving element 50 outputs, to the control electrodes GE of the first and second switching elements 40a and 40b, the control signal corresponding to the optical signal via the control pads 43a and 43b (see FIG. 3). The electrical conduction between the first output-side lead 20a and the second output-side lead 20b is controlled thereby.

Figure 7A:
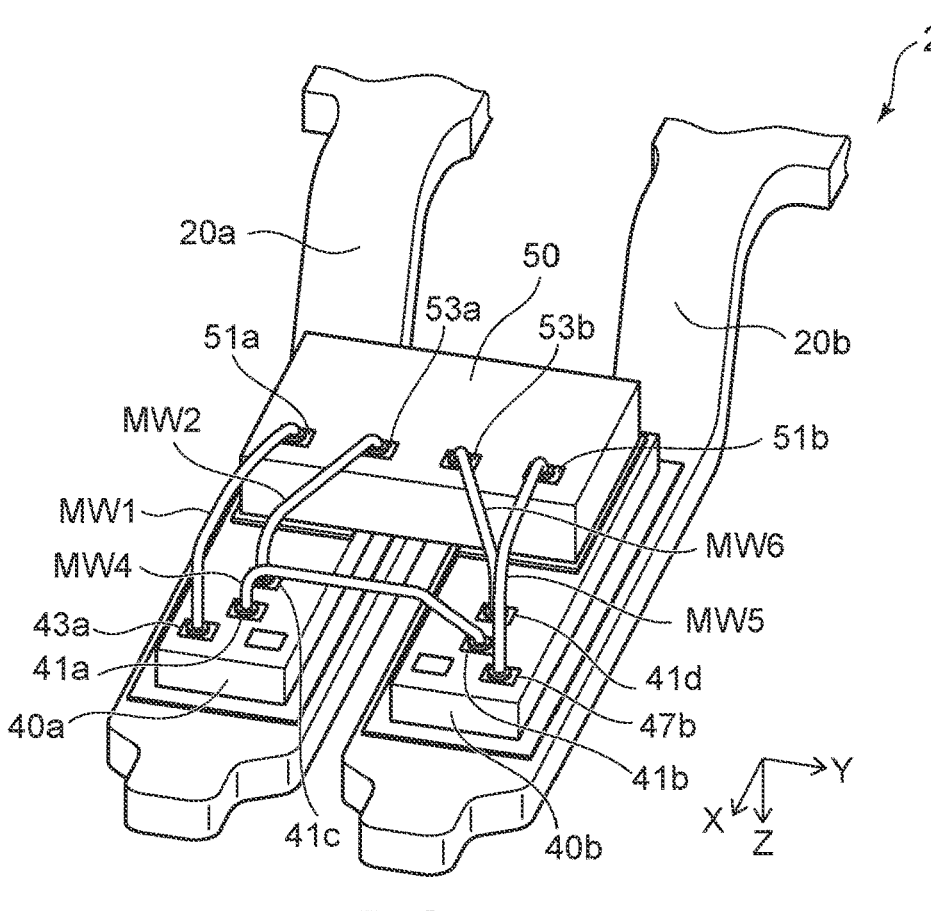
FIGS. 7A and 7B are schematic views showing a part of a semiconductor device according to a modification of the embodiment.
Figure 7B:
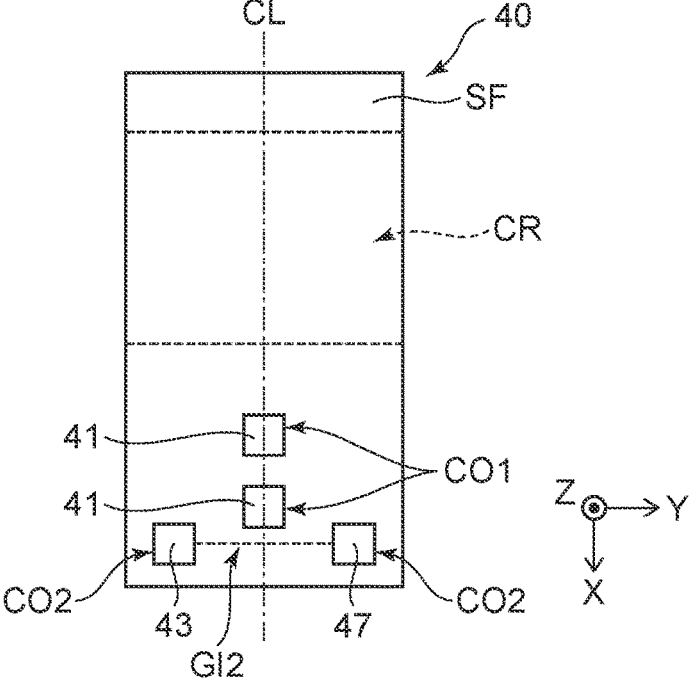

FIGS. 7A and 7B are schematic views showing a part of a semiconductor device 2 according to a modification of the embodiment. FIG. 7A is a perspective view showing the switching element 40 and the light-receiving element 50. FIG. 7B is a plan view showing the front side of the switching element 40.

The semiconductor device 2 includes the first switching element 40a and the second switching element 40b. The first switching element 40a is provided on the first output-side lead 20a with the first connection member CM1 interposed. The second switching element 40b is provided on the second output-side lead 20b with another first connection member CM1 interposed. The first output-side lead 20a and the second output-side lead 20b are arranged, for example, in the Y-direction.

The light-receiving element 50 is provided over the first switching element 40a and the second switching element 40b. The light-receiving element 50 includes first bonding pads 51a and 51b and second bonding pads 53a and 53b at the front side of the light-receiving element 50 that faces the light-emitting element 30.

The first switching element 40a and the second switching element 40b also are arranged in the Y-direction. The first bonding pads 51a and 51b and the second bonding pads 53a and 53b are arranged, for example, in the Y-direction on the front surface of the light-receiving element 50.

The second bonding pad 53a and the second bonding pad 53b are provided between the first bonding pad 51a and the first bonding pad 51b. The second bonding pad 53a is provided between the first bonding pad 51a and the second bonding pad 53b. The second bonding pad 53b is provided between the second bonding pad 53a and the first bonding pad 51b.

The first bonding pad 51a is electrically connected to the control pad 43a of the first switching element 40a via the first conductive member MW1. The second bonding pad 53a is electrically connected to a front-side electrode 41c of the first switching element 40a via the second conductive member MW2.

The first bonding pad 51b is electrically connected to a control pad 47b of the second switching element 40b via a fifth conductive member MW5. The second bonding pad 53b is electrically connected to a front-side electrode 41d of the second switching element 40b via a sixth conductive member MW6. The front-side electrode 41b of the second switching element 40b is electrically connected to the front-side electrode 41a of the first switching element 40a via the fourth conductive member MW4. The fifth conductive member MW5 and the sixth conductive member MW6 are, for example, metal wires.

The second conductive member MW2 is connected to the front-side electrode 41c between the front-side electrode 41a and the position at which the light-receiving element 50 and the first switching element 40a are connected. Also, the sixth conductive member MW6 is connected to the front-side electrode 41d between the front-side electrode 41b and the position at which the light-receiving element 50 and the second switching element 40*b* are connected. Thereby, the second conductive member MW2 and the sixth conductive member MW6 are provided without crossing the fourth conductive member MW4 in a direction perpendicular to the front surface of the switching element 40 connected to the light-receiving element 50 (e.g., the Z-direction).

By such an arrangement of the conductive members MW, it is possible to reduce the looping heights of the first conductive member MW1, the second conductive member MW2, the fifth conductive member MW5, and the sixth conductive member MW6. Accordingly, the third resin member 80 can have the reduced height in the Z-direction.

As shown in FIG. 7B, for example, the insulating member SF on the front surface side of the switching element 40 has the two openings CO1 and the two openings CO2. The front-side electrode 41 includes portions exposed respectively in the two openings CO1. In FIG. 7A, the first switching element 40*a* includes the portions of the front-side electrode 41 exposed in the openings CO1 that are distinguishably denoted as the front-side electrodes 41*a* and 41*c*; and the second switching element 40*b* also includes the portions of the front-side electrode 41 exposed in the openings CO1 that are distinguishably denoted as the front-side electrodes 41*b* and 41*d*.

The openings CO1 are provided on the center line CL extending in the X-direction and apart from each other; and the front-side electrodes 41 are exposed in the openings CO1. In FIG. 7B, two openings CO1 are apart from each other, but the example is not limited thereto. Alternatively, the two openings CO1 may be linked to each other.

The openings CO2 are provided with a line-symmetrical arrangement with respect to the center line CL. The control pad 43 and the control pad 47 are exposed respectively in the two openings CO2. The control pad 43 and the control pad 47 are electrically connected, for example, via the control wiring GI2.

The openings CO1 are provided between the control wiring GI2 and the connection region CR at which the light-receiving element 50 is connected to the switching element 40. The two openings CO2 are provided respectively at the corners of the quadrilateral at the front surface side of the switching element 40.

Figure 8:
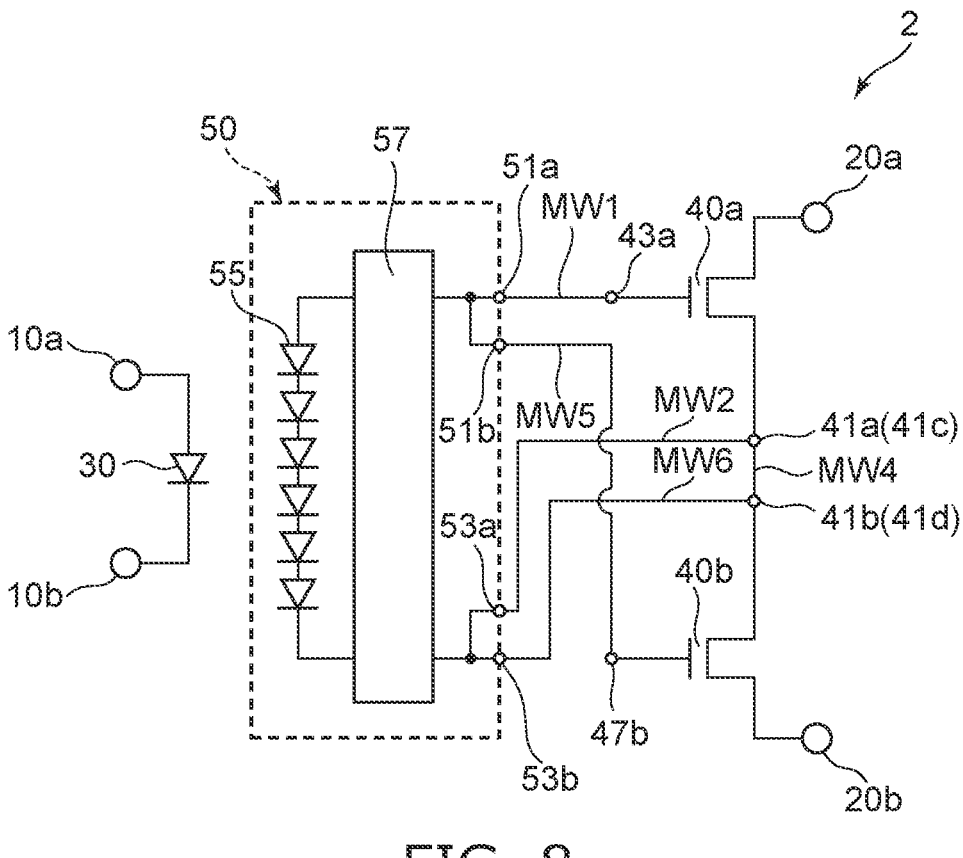
FIG. 8 is a circuit diagram showing a semiconductor device according to a modification of the embodiment.

FIG. 8 is a circuit diagram showing a semiconductor device 2 according to a modification of the embodiment. In the example, the light-receiving element 50 includes the first bonding pads 51*a* and 51*b* and the second bonding pads 53*a* and 53*b*.

The first bonding pads 51*a* and 51*b* are electrically connected to, for example, the anode side of the photodiodes 55 via the control circuit 57. The second bonding pads 53*a* and 53*b* are electrically connected to, for example, the cathode side of the photodiodes 55 via the control circuit 57.

The first bonding pad 51*a* is electrically connected to the control pad 43*a* of the first switching element 40*a* via the first conductive member MW1. The first bonding pad 51*b* is electrically connected to the control pad 47*b* of the second switching element 40*b* via the fifth conductive member MW5.

The second bonding pad 53*a* is electrically connected to the front-side electrode 41*c* of the first switching element 40*a* via the second conductive member MW2. The second bonding pad 53*b* is electrically connected to the front-side electrode 41*d* of the second switching element 40*b* via the sixth conductive member MW6. The front-side electrode 41*a* of the first switching element 40*a* is connected to the front-side electrode 41*b* of the second switching element 40*b* via the fourth conductive member MW4.

The light-emitting element 30 is electrically connected to the first and second input-side leads 10*a* and 10*b*. The first input-side lead 10*a* is electrically connected to, for example, the anode side of the light-emitting element 30. The second input-side lead 10*b* is electrically connected to, for example, the cathode side of the light-emitting element 30.

The first output-side lead 20*a* is electrically connected to the backside electrode 45 of the first switching element 40*a* (see FIG. 3). The second output-side lead 20*b* is electrically connected to the backside electrode 45 of the second switching element 40*b* (see FIG. 3).

The embodiments include the following aspect:

Note 1: A semiconductor device, comprising:
an input-side lead;
a light-emitting element provided on the input-side lead;
a first output-side lead facing the input-side lead via the light-emitting element;
a first switching element provided on the first output-side lead and positioned between the light-emitting element and the first output-side lead, the first switching element including a backside electrode, a front-side electrode and a control pad, the backside electrode being connected to the first output-side lead, the front-side electrode being positioned at a side opposite to the backside electrode, the front-side electrode and the control pad being arranged along a front surface side of the first switching element;
a light-receiving element provided on the first switching element, the light-receiving element being connected to the front-side electrode of the first switching element via an insulative connection member, the light-receiving element being positioned between the first switching element and the light-emitting element, the light-receiving element including a first bonding pad and a second bonding pad, the first bonding pad being electrically connected to the control pad of the first switching element via a first conductive member, the second bonding pad being electrically connected to the front-side electrode of the first switching element via a second conductive member; and
a first resin member sealing the light-emitting element on the input-side lead and sealing the first switching element and the light-receiving element on the first output-side lead, the first resin member including a portion interposed between the light-emitting element and the light-receiving element, the first resin member transmitting light radiated from the light-emitting element toward the light-receiving element.

Note 2: The device according to note 1, further comprising:
a second output-side lead arranged with the first output-side lead, the second output-side lead having a front side facing the input-side lead; and
a second switching element provided on the front side of the second output-side lead, the second switching element including another front-side electrode, another back-side electrode and another control pad, said another back-side electrode being connected to the second out-put side lead,
the light-receiving element being provided over the first switching element and the second switching element, the light-receiving element being connected to said another front-side electrode of the second switching element via another insulative connection member.

Note 3: The device according to note 2, wherein the first resin member further seals the second switching element on the second output-side lead.

Note 4: The device according to note 2 or 3, wherein
the light-receiving element has a front surface facing the
light-emitting element and a back surface connected to
the first and second switching elements, the first bond-
ing pad and the second bonding pad of the light-
receiving element being provided on the front surface
of the light-receiving element,
the first switching element having a front surface con-
nected to the light-receiving element, the first bonding
pad of the light-receiving element overlapping the first
switching element in a direction perpendicular to the
front surface of the first switching element,
the second switching element having a front surface
connected to the light-receiving element, the second
bonding pad of the light-receiving element overlapping
the second switching element in a direction perpen-
dicular to the front surface of the second switching
element.
Note 5: The device according to any one of notes 2 to 4,
wherein
the first bonding pad of the light-receiving element is
electrically connected to the control pad of the first
switching element via the first conductive member,
the control pad of the first switching element being
electrically connected to said another control pad of the
second switching element via a third conductive mem-
ber,
the front-side electrode of the first switching element is
electrically connected to said another front-side elec-
trode of the second switching element via a fourth
conductive member,
the second bonding pad of the light-receiving element is
electrically connected to said another front-side elec-
trode of the second switching element via the second
conductive member, and
the second bonding pad of the light-receiving element is
electrically connected to the front-side electrode of the
first switching element via the second and fourth con-
ductive members.
Note 6: The device according to note 5, wherein
the light-receiving element has a front surface facing the
light-emitting element, and
the first conductive member and the second conductive
member are provided without crossing the third and
fourth conductive members in a direction perpendicular
to the front surface of the light-receiving element.
Note 7: The device according to any one of notes 2 to 6,
wherein
the light-receiving element has a front surface facing the
light-emitting element,
the light-receiving element has a first thickness in a
direction perpendicular to the front surface of the
light-receiving element facing the light-emitting ele-
ment, and
each of the first and second switching elements has a
second thickness in the same direction perpendicular to
the front surface of the light-receiving element, the first
thickness being greater than the second thickness.
Note 8: The device according to note 3, further compris-
ing:
a second resin member sealing the light-emitting element
on the input-side lead, the first resin member covering
the light-emitting element with the second resin mem-
ber interposed; and a third resin member covering the first resin member, the
input-side lead, the first output-side lead, and the sec-
ond output-side lead, the third resin member shielding
external light,
the input-side lead, the first output-side lead, and the
second output-side lead including portions extending
out of the third resin member.
Note 9: The device according to any one of notes 1 to 8,
further comprising:
a second resin member sealing the light-emitting element
on the input-side lead, the first resin member covering
the light-emitting element with the second resin mem-
ber interposed; and
a third resin member covering the first resin member, the
input-side lead, and the first output-side lead, the third
resin member shielding external light,
the input-side lead and the first output-side lead including
portions extending out of the third resin member.
Note 10: The device according to note 5, wherein
the first switching element and the second switching
element each include a semiconductor part, a control
electrode, an insulating member, a first control pad and
a second control pad,
the backside electrode is electrically connected to a back-
side of the semiconductor part,
the front-side electrode is electrically connected to a front
side of the semiconductor part,
the control electrode is provided at the front side of the
semiconductor part, the control electrode being pro-
vided between the front-side electrode and the backside
electrode and electrically insulated from the semicon-
ductor part and the front-side electrode,
the insulating member covers the front-side electrode at
the front side of the semiconductor part and includes
openings, the front-side electrode including a first
bonding region and a second bonding region exposed
respectively in the openings of the insulating member,
the first and second bonding regions being apart from
each other,
the first control pad and the second control pad are
provided at the front side of the semiconductor part and
apart from each other, the first and second control pads
being electrically connected to the control electrode,
the first conductive member electrically connects the first
bonding pad of the light-receiving element and the first
control pad of the first switching element,
the second conductive member electrically connects the
second bonding pad of the light-receiving element and
the second bonding region of the second switching
element,
the third conductive member electrically connects the
second control pad of the first switching element and
the first control pad of the second switching element,
and
the fourth conductive member electrically connects the
second bonding region of the first switching element
and the first bonding region of the second switching
element.
Note 11: The device according to note 10, wherein the
first and second switching elements have the same
layouts, at the front surface side, of the first and second
bonding regions and the first and second control pads.
Note 12: The device according to note 11, wherein the
layouts of the first and second switching elements are
line-symmetric with respect to symmetry lines along
the front sides of the first and second switching elements, the symmetry lines crossing an arrangement direction of the first and second switching elements.

Note 13: The device according to note 10, wherein the first and second switching elements each include the first and second bonding regions arranged in a first direction along the front side of the semiconductor part and the first and second control pads arranged in the first direction along the front side of the semiconductor part, the first and second control pads being apart from the first and second bonding regions in a second direction crossing the first direction.

Note 14: The device according to note 13, wherein. the first switching element and the second switching element are arranged in the first direction, the first and second bonding regions of the first switching element and the first and second bonding regions of the second switching element are arranged in the first direction, and the first and second control pads of the first switching element and the first and second control pads of the second switching element are arranged in the first direction.

Note 15: The device according to any one of notes 2 to 14, wherein the light-receiving element further includes a third bonding pad electrically connected to the first bonding pad and a fourth bonding pad electrically connected to the second bonding pad, the first switching element and the second switching element each includes a semiconductor part, a control electrode, an insulating member, a first control pad and a second control pad, the backside electrode is electrically connected to a backside of the semiconductor part, the front-side electrode is electrically connected to a front side of the semiconductor part, the control electrode is provided at the front side of the semiconductor part, the control electrode being provided between the front-side electrode and the backside electrode and electrically insulated from the semiconductor part and the front-side electrode, the insulating member covers the front-side electrode at the front side of the semiconductor part and includes openings, the front-side electrode including a first bonding region and a second bonding region exposed respectively in the openings of the insulating member, the first and second bonding regions being apart from each other, the first control pad and the second control pad are provided at the front side of the semiconductor part and apart from each other, the first and second control pads being electrically connected to the control electrode, the first bonding pad of the light-receiving element is electrically connected to the first control pad of the first switching element via the first conductive member, the second bonding pad of the light-receiving element is electrically connected to the second bonding region of the first switching element via the second conductive member, the third bonding pad of the light-receiving element is electrically connected to the second control pad of the second switching element via a fifth conductive member, the fourth bonding pad of the light-receiving element is electrically connected to the second bonding region of the second switching element via a sixth conductive member, and the first bonding region of the first switching element is electrically connected to the first bonding region of the second switching element via a fourth conductive member.

Note 16: The device according to claim 15, wherein the first control pad and the second control pad are arranged in a first direction along the front side of the semiconductor part, and the first bonding region and the second bonding region are arranged in a second direction crossing the first direction along the front side of the semiconductor part, the first and second bonding regions being apart from the first and second control pads. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and overview of the invention.

What is claimed is:

1. A semiconductor device, comprising:
an input-side lead;
a light-emitting element provided on the input-side lead;
a first output-side lead facing the input-side lead with the light-emitting element interposed;
a first switching element provided on the first output-side lead and positioned between the light-emitting element and the first output-side lead, the first switching element including a back-side electrode, a front-side electrode and a control pad, the back-side electrode being connected to the first output-side lead, the front-side electrode being positioned at a front side of the first switching element opposite to the back-side electrode, the front-side electrode and the control pad being provided at the front side of the first switching element;
a light-receiving element provided on the first switching element, the light-receiving element being connected to the front-side electrode of the first switching element, the light-receiving element being stacked on the front-side electrode of the first switching element with an insulative connection member interposed in a direction perpendicular to a front surface of the first switching element, the light-receiving element being positioned between the first switching element and the light-emitting element, the light-receiving element including a first bonding pad and a second bonding pad, the first bonding pad being electrically connected to the control pad of the first switching element via a first conductive member, the second bonding pad being electrically connected to the front-side electrode of the first switching element via a second conductive member; and
a first resin member sealing the light-emitting element on the input-side lead and sealing the first switching element and the light-receiving element on the first output-side lead, the first resin member including a portion interposed between the light-emitting element and the light-receiving element, the first resin member transmitting light radiated from the light-emitting element toward the light-receiving element.

2. The device according to claim 1, further comprising:

a second output-side lead having a front side facing the input-side lead; and a second switching element provided on the front side of the second output-side lead, the second switching element including another front-side electrode, another back-side electrode and another control pad, said other back-side electrode being connected to the second output-side lead, the light-receiving element being provided on the first switching element and the second switching element, the light-receiving element being connected to said other front-side electrode of the second switching element, the light-receiving element being stacked on said other front-side electrode of the second switching element with another insulative connection member interposed.

3. The device according to claim 2, wherein the first resin member further seals the second switching element on the second output-side lead.

4. The device according to claim 2, wherein the light-receiving element has a front surface facing the light-emitting element and a back surface connected to the first and second switching elements, the first bonding pad and the second bonding pad of the light-receiving element being provided on the front surface of the light-receiving element, the front surface of the first switching element being connected to the light-receiving element, the first bonding pad of the light-receiving element overlapping the first switching element in the direction perpendicular to the front surface of the first switching element, the second switching element having a front surface connected to the light-receiving element, the second bonding pad of the light-receiving element overlapping the second switching element in a direction perpendicular to the front surface of the second switching element.

5. The device according to claim 2, wherein the control pad of the first switching element is electrically connected to said other control pad of the second switching element via a third conductive member, the front-side electrode of the first switching element is electrically connected to said other front-side electrode of the second switching element via a fourth conductive member, the second bonding pad of the light-receiving element is electrically connected to said other front-side electrode of the second switching element via the second conductive member, and the second bonding pad of the light-receiving element is electrically connected to the front-side electrode of the first switching element via the second and fourth conductive members.

6. The device according to claim 5, wherein the light-receiving element has a front surface facing the light-emitting element, and the first conductive member and the second conductive member are provided without crossing the third and fourth conductive members in a direction perpendicular to the front surface of the light-receiving element.

7. The device according to claim 2, wherein the light-receiving element has a front surface facing the light-emitting element, the light-receiving element has a first thickness in a direction perpendicular to the front surface of the light-receiving element, and each of the first and second switching elements has a second thickness in the direction perpendicular to the front surface of the light-receiving element, the first thickness being greater than the second thickness.

8. The device according to claim 3, further comprising:

a second resin member sealing the light-emitting element on the input-side lead, the first resin member covering the light-emitting element with the second resin member interposed; and a third resin member covering the first resin member, the input-side lead, the first output-side lead, and the second output-side lead, the third resin member shielding external light, the input-side lead, the first output-side lead, and the second output-side lead including portions extending outside of the third resin member.

9. The device according to claim 1, further comprising:

a second resin member sealing the light-emitting element on the input-side lead, the first resin member covering the light-emitting element with the second resin member interposed; and a third resin member covering the first resin member, the input-side lead, and the first output-side lead, the third resin member shielding external light, the input-side lead and the first output-side lead including portions extending outside of the third resin member.

10. The device according to claim 5, wherein the first switching element and the second switching element each include a semiconductor part, a control electrode, an insulating member, a first control pad and a second control pad, for each of the first and second switching elements, the respective back-side electrode is electrically connected to a back side of the respective semiconductor part, for each of the first and second switching elements, the respective front-side electrode is electrically connected to a front side of the respective semiconductor part, for each of the first and second switching elements, the respective control electrode is provided at the front side of the respective semiconductor part, the respective control electrode being provided between the respective front-side electrode and the respective back-side electrode and electrically insulated from the respective semiconductor part and the respective front-side electrode, for each of the first and second switching elements, the respective insulating member covers the respective front-side electrode at the front side of the respective semiconductor part and includes openings, the respective front-side electrode including a first bonding region and a second bonding region exposed respectively in the openings of the respective insulating member, the respective first and second bonding regions being apart from each other, for each of the first and second switching elements, the respective first control pad and the respective second control pad are provided at the front side of the respective semiconductor part and apart from each other, the respective first and second control pads being electrically connected to the respective control electrode, the first conductive member electrically connects the first bonding pad of the light-receiving element and the first control pad of the first switching element, the second conductive member electrically connects the second bonding pad of the light-receiving element and the second bonding region of the second switching element, the third conductive member electrically connects the second control pad of the first switching element and the first control pad of the second switching element, and the fourth conductive member electrically connects the second bonding region of the first switching element and the first bonding region of the second switching element.

11. The device according to claim 10, wherein the first and second switching elements have the same layouts, at front sides, of the respective first and second bonding regions and the respective first and second control pads.

12. The device according to claim 11, wherein the layouts of the first and second switching elements are line-symmetric with respect to symmetry lines along front sides of the first and second switching elements, the symmetry lines crossing a direction in which the first and second switching elements overlap.

13. The device according to claim 10, wherein the first and second switching elements each include the first and second bonding regions overlapping in a first direction along the front side of the semiconductor part and the respective first and second control pads overlapping in the first direction along the front side of the semiconductor part, the respective first and second control pads being apart from the respective first and second bonding regions in a second direction crossing the first direction.

14. The device according to claim 13, wherein the first switching element overlaps the second switching element in the first direction, the first and second bonding regions of the first switching element overlap the first and second bonding regions of the second switching element in the first direction, and the first and second control pads of the first switching element overlap the first and second control pads of the second switching element in the first direction.

15. The device according to claim 2, wherein the light-receiving element further includes a third bonding pad electrically connected to the first bonding pad and a fourth bonding pad electrically connected to the second bonding pad, the first switching element and the second switching element each include a semiconductor part, a control electrode, an insulating member, a first control pad and a second control pad, the respective back-side electrodes being electrically connected to back sides of the respective semiconductor parts, for each of the first and second switching elements, the respective front-side electrode is electrically connected to a front side of the respective semiconductor part, for each of the first and second switching elements, the respective control electrode is provided at the front side of the respective semiconductor part, the respective control electrode being provided between the respective front-side electrode and the respective back-side electrode and electrically insulated from the respective semiconductor part and the respective front-side electrode, for each of the first and second switching elements, the respective insulating member covers the respective front-side electrode at the front side of the respective semiconductor part and includes openings, the respective front-side electrode including a first bonding region and a second bonding region exposed respectively in the openings of the respective insulating member, the respective first and second bonding regions being apart from each other, for each of the first and second switching elements, the respective first control pad and the respective second control pad are provided at the front side of the respective semiconductor part and apart from each other, the respective first and second control pads being electrically connected to the respective control electrode, the first bonding pad of the light-receiving element is electrically connected to the first control pad of the first switching element via the first conductive member, the second bonding pad of the light-receiving element is electrically connected to the second bonding region of the first switching element via the second conductive member, the third bonding pad of the light-receiving element is electrically connected to the second control pad of the second switching element via a fifth conductive member, the fourth bonding pad of the light-receiving element is electrically connected to the second bonding region of the second switching element via a sixth conductive member, and the first bonding region of the first switching element is electrically connected to the first bonding region of the second switching element via a fourth conductive member.

16. The device according to claim 15, wherein for each of the first and second switching elements, the respective first control pad overlaps the respective second control pad in a first direction along the front side of the semiconductor part, and for each of the first and second switching elements, the respective first bonding region overlaps the respective second bonding region in a second direction crossing the first direction along the front side of the semiconductor part, the respective first and second bonding regions further being apart from the respective first and second control pads.

* * * * *